(12) United States Patent
Wirz et al.

(10) Patent No.: US 12,745,601 B2
(45) Date of Patent: Sep. 22, 2026

(54) MOUNT TAPE HAVING AN INNER SUPPORT LAYER BETWEEN ADHESIVE LAYERS FOR SEMICONDUCTOR DEVICE ASSEMBLY

(71) Applicant: Micron Technology, Inc., Boise, ID (US)

(72) Inventors: Brandon P. Wirz, Taichung City (TW); Sui Chi Huang, Taichung City (TW); Youngrae Kim, Taichung City (TW)

(73) Assignee: Micron Technology, Inc., Boise, ID (US)

( * ) Notice: Subject to any disclaimer, the term of this patent is extended or adjusted under 35 U.S.C. 154(b) by 869 days.

(21) Appl. No.: 17/820,428

(22) Filed: Aug. 17, 2022

(65) Prior Publication Data

US 2024/0063047 A1 Feb. 22, 2024

(51) Int. Cl.

| | |
|---|---|
| ***H10P 72/70*** | (2026.01) |
| ***C09J 7/20*** | (2018.01) |
| ***C09J 7/25*** | (2018.01) |
| ***C09J 7/28*** | (2018.01) |
| ***C09J 7/30*** | (2018.01) |
| ***H10P 54/00*** | (2026.01) |

(52) U.S. Cl.

CPC ............ *H10P 72/7402* (2026.01); *C09J 7/20* (2018.01); *C09J 7/25* (2018.01); *C09J 7/28* (2018.01); *C09J 7/30* (2018.01); *H10P 54/00* (2026.01); *C09J 2203/326* (2013.01); *C09J 2203/366* (2020.08); *C09J 2301/1242* (2020.08); *C09J 2400/10* (2013.01); *C09J 2400/143* (2013.01); *C09J 2400/163* (2013.01); *C09J 2479/086* (2013.01)

(58) Field of Classification Search

CPC ................. H01L 21/6836; H01L 21/78; H01L 2221/68322; H01L 2221/68381; H01L 21/6835; H01L 2221/68327; C09J 7/20; C09J 7/25; C09J 7/28; C09J 7/30; C09J 2203/326; C09J 2203/366; C09J 2301/1242; C09J 2400/10; C09J 2400/143; C09J 2400/163; C09J 2479/086; C09J 2301/502; C09J 5/00; C09J 5/06; H10P 72/7402; H10P 54/00; H10P 72/74; H10P 72/744; H10P 72/7414; H10P 72/7416

See application file for complete search history.

(56) References Cited

U.S. PATENT DOCUMENTS 12,275,867 B2 * 4/2025 Choi ...................... C09J 133/08

FOREIGN PATENT DOCUMENTS

EP 2078741 A1 * 7/2009 ................ C09J 5/06
WO 2021246680 A1 12/2021

* cited by examiner

*Primary Examiner* — Thanh T Nguyen
(74) *Attorney, Agent, or Firm* — Harrity & Harrity, LLP

(57) ABSTRACT

Implementations described herein relate to a mount tape and methods of using the mount tape for semiconductor device manufacturing. The mount tape may include a first adhesive layer configured for release at a first stage of a semiconductor device manufacturing process, a second adhesive layer configured for release at a second stage of the semiconductor device manufacturing process, and an inner support layer positioned between the first adhesive layer and the second adhesive layer and configured for removal during the semiconductor device manufacturing process.

16 Claims, 14 Drawing Sheets

1400

MOUNT TAPE HAVING AN INNER SUPPORT LAYER BETWEEN ADHESIVE LAYERS FOR SEMICONDUCTOR DEVICE ASSEMBLY

TECHNICAL FIELD

The present disclosure generally relates to semiconductor devices and methods of forming semiconductor devices. For example, the present disclosure relates to a mount tape having an inner support layer between adhesive layers and a method of using the mount tape for semiconductor device assembly.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes mechanisms for connecting internal components to external components (e.g., a circuit board), such as via balls, pins, or leads. A semiconductor package is sometimes referred to as a semiconductor device assembly.

DETAILED DESCRIPTION

Figure 1:
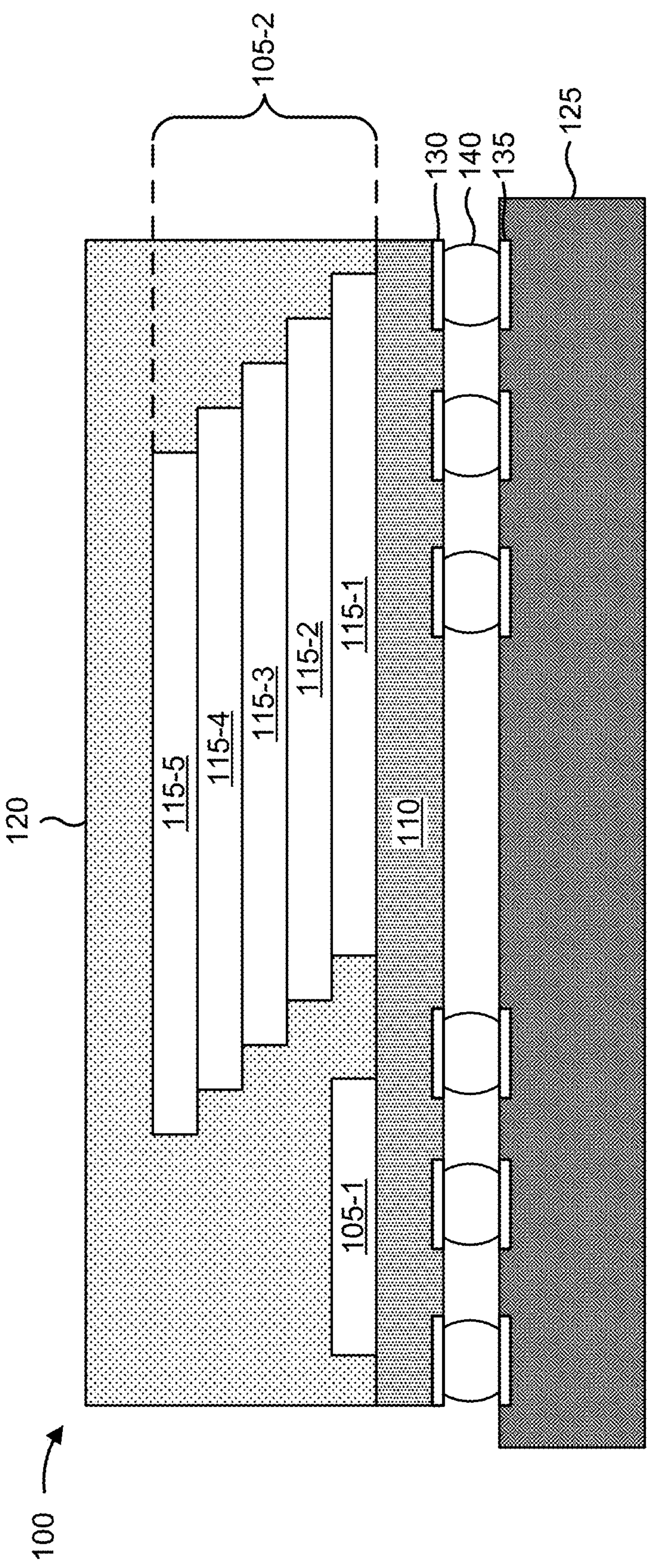
FIG. 1 is a diagram of an example apparatus that may be manufactured using techniques described herein.

Over time, semiconductor packages have become smaller and semiconductor dies have become thinner to satisfy smaller design and packaging requirements. During semiconductor device manufacturing, a sheet of mount tape may be attached to a semiconductor wafer on which the semiconductor dies are fabricated. The semiconductor wafer may be diced, while attached to the mount tape, to form multiple singulated semiconductor dies. A singulated semiconductor die may then be picked up from the mount tape by a manufacturing device, sometimes called a pick-and-place machine, and placed on a target object, such as a substrate or another die (e.g., in the case of die stacking). As semiconductor dies become thinner (e.g., with a thickness of 50 microns or less, 40 microns or less, 30 microns or less, 20 microns or less, or thinner), picking and placing of a semiconductor die becomes increasingly likely to damage the semiconductor die (e.g., by causing a crack or stress in the semiconductor die due to handling). This may reduce yield of the semiconductor device manufacturing process, may cause reliability issues for semiconductor dies, and may generate waste from inoperable semiconductor dies that need to be discarded.

Some implementations described herein are directed to a mount tape, and a method of using the mount tape, that reduces the likelihood of damage to semiconductor dies during the pick-and-place process. For example, the mount tape may include a strong inner support layer sandwiched between adhesive layers. A first adhesive layer may adhere the inner support layer to a supporting element, such as a tape backing and/or a wafer support structure (e.g., a film frame or another type of wafer support structure), and a second adhesive layer may adhere the inner support layer to a semiconductor wafer. The semiconductor wafer may be diced while mounted on the mount tape (along with the inner support layer and the adhesive layers of the mount tape) to form multiple singulated semiconductor dies. A singulated semiconductor die may be ejected (e.g., removed) from the supporting element by releasing (e.g., breaking down adherence of) the first adhesive layer without releasing the second adhesive layer. The singulated semiconductor die may then be picked along with the inner support layer, which remains adhered to the singulated semiconductor die via the second adhesive layer. The inner support layer may be removed from the singulated semiconductor die after placement on a target object (e.g., a substrate or another die) by releasing the second adhesive layer.

Because the singulated semiconductor die is ejected (e.g., picked up) from the wafter supporting element, transported to the target object, and placed on the target object while being adhered to the strong inner support layer of the mount tape, the likelihood that the singulated semiconductor die is damaged during the pick-and-place process is reduced. The inner support layer may also support the singulated semiconductor die through various stages of a semiconductor manufacturing process, such as a dicing stage, which may reduce stress and/or warpage of the singulated semiconductor die. Furthermore, the inner support layer may protect the singulated semiconductor die from impingement and particle contamination. As a result, techniques described herein may increase yield of the semiconductor device manufacturing process, may improve reliability of semiconductor dies, may reduce variation across semiconductor dies, and may reduce waste because fewer semiconductor dies need to be discarded.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
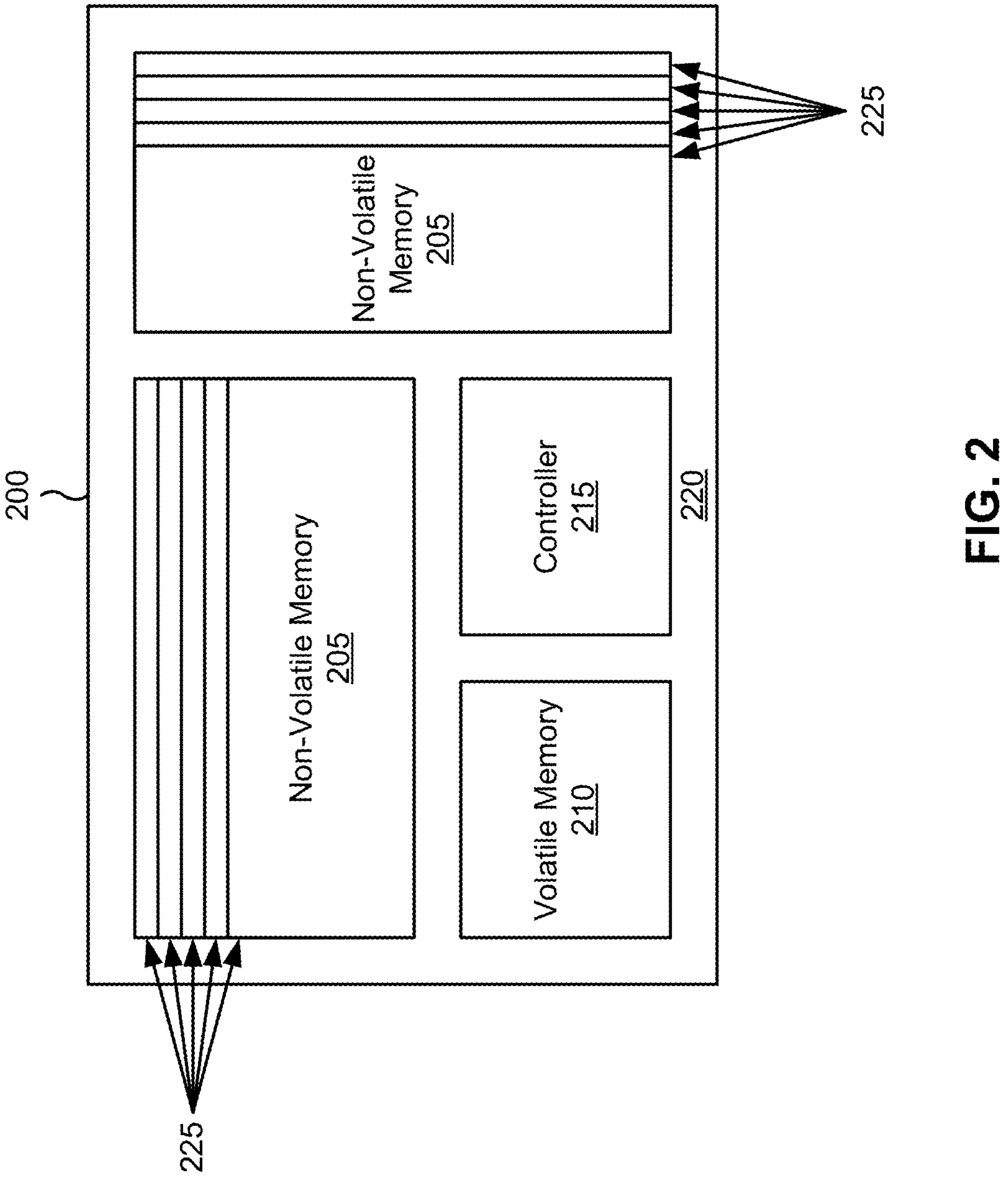
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
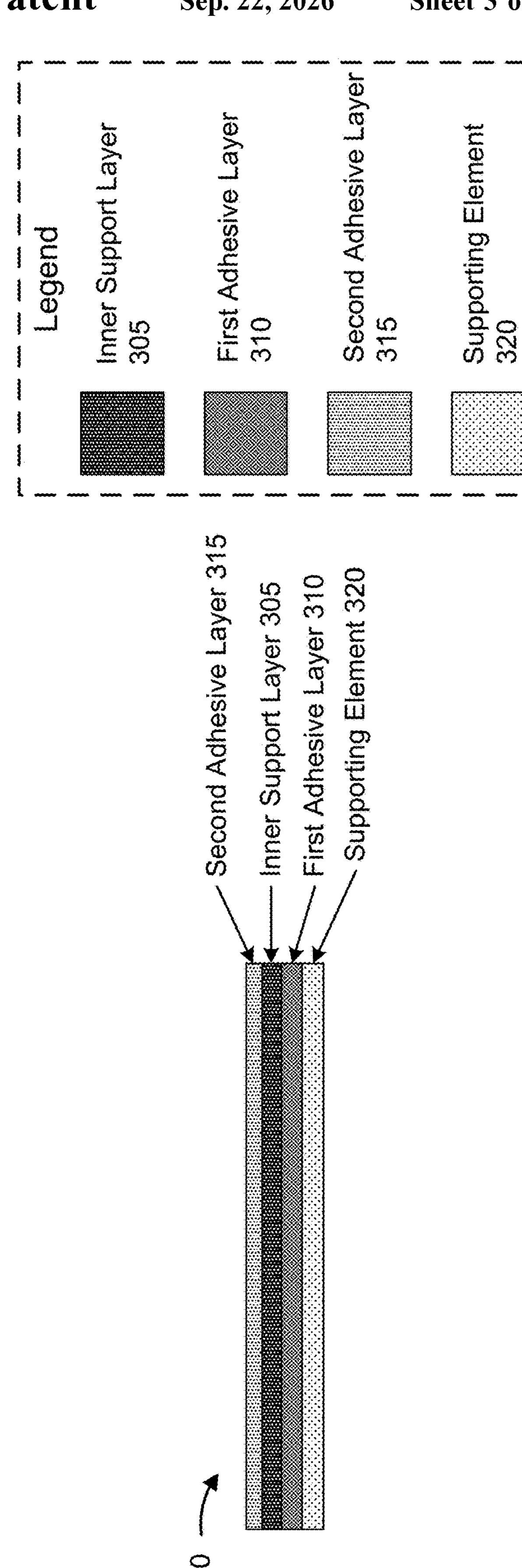
FIG. 3 is a diagram of example mount tape having an inner support layer between adhesive layers.

FIG. 3 is a diagram of example mount tape 300 having an inner support layer 305 between adhesive layers. As shown, the inner support layer 305 may be between a first adhesive layer 310 and a second adhesive layer 315. In some implementations, the mount tape 300 includes a supporting element 320, such as a tape backing with a first surface that adheres to the first adhesive layer 310 and a second surface (e.g., a non-adherent surface) opposite the first surface.

Alternatively, the supporting element 320 may be separate from the mount tape 300. For example, the supporting element 320 may include a wafer support system (WSS) or another type of wafer support structure. In some cases, the mount tape 300 (e.g., the combination of the inner support layer 305, the first adhesive layer 310, the second adhesive layer 315, and a tape backing if included) may be called a mount tape assembly.

As shown in FIG. 3, the inner support layer 305 may be positioned between or sandwiched between the first adhesive layer 310 and the second adhesive layer 315. In some implementations, the inner support layer 305 comprises, consists of, or consists essentially of glass, silicon, sapphire, metal, or polyimide. In some implementations, the inner support layer 305 is opaque (e.g., with a light transmittance percentage that is less than or equal to a threshold, such as zero percent, ten percent, or twenty percent) to enable the first adhesive layer 310 and the second adhesive layer 315 to be released at different process stages from one another, as described in more detail below. Alternatively, the inner support layer 305 may be transparent (e.g., with a light transmittance percentage that is greater than or equal to a threshold, such as eighty percent, ninety percent, or one hundred percent) depending on the environmental conditions used to release the first adhesive layer 310 and the second adhesive layer 315 at different process stages. In some implementations, the inner support layer 305 may be opaque to a first wavelength of light (e.g., used to release the first adhesive layer 310) and transparent to a second wavelength of light (e.g., used to release the second adhesive layer 315).

In some implementations, the inner support layer 305 has a thickness in a range from approximately 10 microns to approximately 100 microns. The materials and thicknesses described herein for the inner support layer 305 result in the inner support layer 305 having sufficient strength to keep a singulated semiconductor die made from a thin wafer relatively rigid during a pick-and-place process, thereby reducing a likelihood of damage to the singulated semiconductor die, as described in more detail elsewhere herein. These materials also enable the inner support layer 305 to be diced at the same time as (e.g., during a same process stage as) a semiconductor wafer adhered to the mount tape 300.

In some implementations, the inner support layer 305 has a thickness in a range from approximately 30 microns to approximately 50 microns. This narrower range of thicknesses for the inner support layer 305 provides sufficient strength to protect the singulated semiconductor die from damage during a pick-and-place process while also reducing a time required to dice a semiconductor wafer mounted to the mount tape 300 as compared to a thicker inner support layer 305. As described in more detail below, the mount tape 300, including the inner support layer 305, is diced when the semiconductor wafer is diced. Thus, a thinner inner support layer 305 leads to shorter dicing time, which reduces manufacturing time.

As further shown in FIG. 3, in some implementations, the first adhesive layer 310 is in contact with a first surface of the inner support layer 305, and the second adhesive layer 315 is in contact with a second surface of the inner support layer 305. The second surface is opposite the first surface (e.g., one of the surfaces may be a top surface of the inner support layer 305 and the other surface may be a bottom surface of the inner support layer 305). However, in some implementations, the mount tape 300 may include one or more layers between the first adhesive layer 310 and the inner support layer 305. Additionally, or alternatively, the mount tape 300 may include one or more layers between the second adhesive layer 315 and the inner support layer 305.

In some implementations, the first adhesive layer 310 is configured to adhere the inner support layer 305 to the supporting element 320. The supporting element 320 may be a tape backing of the mount tape 300, which may have a non-adherent surface opposite the first adhesive layer 310. Alternatively, the supporting element 320 may be separate from the mount tape 300. For example, the supporting element 320 may include a WSS or another type of wafer support structure.

In some implementations, the second adhesive layer 315 is configured to adhere the inner support layer 305 to a semiconductor substrate, such as a semiconductor wafer. The semiconductor wafer may be a thin wafer having a thickness that is less than or equal to, for example, approximately 30 microns, approximately 20 microns, or thinner.

The first adhesive layer 310 may be configured for release (e.g., from the first surface of the inner support layer 305) at a first stage of a semiconductor device manufacturing process, and the second adhesive layer 315 may be configured for release at a second stage of the semiconductor device manufacturing process. Additionally, or alternatively, the first adhesive layer 310 may be configured to be released (e.g., from the first surface of the inner support layer 305) upon exposure to a first environmental condition during the semiconductor device manufacturing process, and the second adhesive layer 315 may be configured to be released (e.g., from the second surface of the inner support layer 305) upon exposure, during the semiconductor device manufacturing process, to a second environmental condition that is different from the first environmental condition. The semiconductor device manufacturing process may be the process described below in connection with FIGS. 4-12 and/or the method 1300 described in connection with FIG. 13. As used herein, "release" may refer to breaking down the adherence of an adhesive layer (e.g., so that an object previously adhered to the adhesive layer can be easily separated from the adhesive layer) and/or removing the adhesive layer from an object to which the adhesive layer is adhered. In some implementations, the inner support layer 305 may be configured for removal during the semiconductor device manufacturing process, such as during the second stage or at a third stage that is subsequent to the second stage.

As an example, in some implementations, the first adhesive layer 310 comprises, consists of, or consists essentially of a first material, and the second adhesive layer 315 comprises, consists of, or consists essentially of a second material that is different from the first material. This enables the first adhesive layer 310 to be released at the first stage without releasing the second adhesive layer 315 at the first stage, such that the second adhesive layer 315 can be released at the second stage (e.g., subsequent to the first stage).

As another example, the first adhesive layer 310 may comprise, consist of, or consist essentially of an ultraviolet release tape, and the second adhesive layer 315 may comprise, consist of, or consist essentially of a heat release tape. This enables the first adhesive layer 310 to be released at a first stage that uses ultraviolet light to release the first adhesive layer 310 (e.g., via application of the ultraviolet light from below the inner support layer 305 and the first adhesive layer 310 in the orientation shown in FIG. 3) without releasing the second adhesive layer 315 at the first stage, such that the second adhesive layer 315 can be released at a second stage that uses heat to release the second adhesive layer 315. In this implementation, the inner support layer 305 may be configured to block the wavelength of ultraviolet light used to release the first adhesive layer 310 (e.g., if application of that wavelength of ultraviolet light to the second adhesive layer 315 would cause the second adhesive layer 315 to be released). For example, the inner support layer 305 may be opaque to the wavelength of ultraviolet light used to release the first adhesive layer 310 (e.g., with a light transmittance percentage, for the wavelength of ultraviolet light, that is less than or equal to a threshold). However, if the ultraviolet light is applied from above the inner support layer 305 and the second adhesive layer 315 in the orientation shown in FIG. 3, then the inner support layer 305 may be transparent to the wavelength of ultraviolet light used to release the first adhesive layer 310 (and the second adhesive layer 315 may be configured such that the second adhesive layer 315 is not released by application of that wavelength of ultraviolet light). Alternatively, if application of the ultraviolet light to the second adhesive layer 315 does not cause release of the second adhesive layer 315, then the inner support layer 305 may be opaque, transparent, or translucent (e.g., depending on a direction from which the ultraviolet light is applied).

Alternatively, the first adhesive layer 310 may comprise, consist of, or consist essentially of a heat release tape, and the second adhesive layer 315 may comprise, consist of, or consist essentially of an ultraviolet release tape. This enables the first adhesive layer 310 to be released at a first stage that uses heat to release the first adhesive layer 310 without releasing the second adhesive layer 315 at the first stage, such that the second adhesive layer 315 can be released at a second stage that uses ultraviolet light to release the second adhesive layer 315. In this implementation, the inner support layer 305 may be configured to allow the wavelength of ultraviolet light used to release the second adhesive layer 315 to pass through the inner support layer 305 to reach the second adhesive layer 315 if the ultraviolet light is applied from below the inner support layer 305. For example, the inner support layer 305 may be transparent to the wavelength of ultraviolet light used to release the second adhesive layer 315 (e.g., with a light transmittance percentage, for the wavelength of ultraviolet light, that is greater than or equal to a threshold) if the ultraviolet light is applied from below the inner support layer 305. If the ultraviolet light is applied from above the inner support layer 305 and the second adhesive layer 315 to release the second adhesive layer 315, then the inner support layer 305 may be opaque, transparent, or translucent.

Alternatively, the first adhesive layer 310 may comprise, consist of, or consist essentially of a first ultraviolet release tape that is released by application of ultraviolet light at a first wavelength (or within a first range of wavelengths), and the second adhesive layer 315 may comprise, consist of, or consist essentially of a second ultraviolet release tape that is released by application of ultraviolet light at a second wavelength (or within a second range of wavelengths). This enables the first adhesive layer 310 to be released at a first stage that uses ultraviolet light of the first wavelength (or within the first range of wavelengths) to release the first adhesive layer 310 (e.g., via application of the ultraviolet light from below the inner support layer 305 in the orientation shown in FIG. 3) without releasing the second adhesive layer 315 at the first stage, such that the second adhesive layer 315 can be released at a second stage that uses ultraviolet light of the second wavelength (or within the second range of wavelengths) to release the second adhesive layer 315. In this implementation, the inner support layer 305 may be configured to block the first wavelength of ultraviolet light used to release the first adhesive layer 310 and to allow light of the second wavelength to pass through the inner support layer 305 (e.g., if application of the first wavelength of ultraviolet light to the second adhesive layer 315 would cause the second adhesive layer 315 to be released, such as if there is an overlap in the first range and the second range and the first wavelength falls within that overlap) if the first wavelength of ultraviolet light is applied from below the inner support layer 305 and the first adhesive layer 310. Alternatively, if application of the first wavelength of ultraviolet light to the second adhesive layer 315 does not cause release of the second adhesive layer 315, then the inner support layer 305 may be opaque, transparent, or translucent. For example, if the first wavelength of ultraviolet light is applied from above the inner support layer 305, then the inner support layer 305 may be transparent to the first wavelength of ultraviolet light to enable the first wavelength of ultraviolet light to be applied to the first adhesive layer 310.

Alternatively, the first adhesive layer 310 may comprise, consist of, or consist essentially of a first heat release tape that is released by application of heat at a first temperature (or within a first range of temperatures), and the second adhesive layer 315 may comprise, consist of, or consist essentially of a second heat release tape that is released by application of heat at a second temperature (or within a second range of temperatures). This enables the first adhesive layer 310 to be released at a first stage that uses heat at the first temperature (or within the first range of temperatures) to release the first adhesive layer 310 without releasing the second adhesive layer 315 at the first stage, such that the second adhesive layer 315 can be released at a second stage that uses heat at the second temperature (or within the second range of temperatures) to release the second adhesive layer 315. The second temperature may be higher than the first temperature so that the second adhesive layer 315 is not released when the first adhesive layer 310 is released. In this implementation, the inner support layer 305 may be opaque, transparent, or translucent.

Thus, in some implementations, at least one of (e.g., only one of or both of) the first adhesive layer 310 or the second adhesive layer 315 comprises, consists of, or consists essentially of an ultraviolet release tape. In an example where only one of the first adhesive layer 310 or the second adhesive layer 315 comprises, consists of, or consists essentially of an ultraviolet release tape, the other one of the first adhesive layer 310 or the second adhesive layer 315 may comprise, consist of, or consist essentially of a heat release tape. Alternatively, both of the first adhesive layer 310 and the second adhesive layer 315 may comprise, consist of, or consist essentially of an ultraviolet release tape. In this case, the first adhesive layer 310 may comprise, consist of, or consist essentially of a first ultraviolet release tape that is released upon application of a first wavelength of light, and the second adhesive layer 315 may comprise, consist of, or consist essentially of a second ultraviolet release tape that is released upon application of a second wavelength of light, that is different from the first wavelength of light, and that is not released upon application of the first wavelength of light.

Similarly, in some implementations, at least one of (e.g., only one of or both of) the first adhesive layer 310 or the second adhesive layer 315 comprises, consists of, or consists essentially of a heat release tape. In an example where only one of the first adhesive layer 310 or the second adhesive layer 315 comprises, consists of, or consists essentially of a heat release tape, the other one of the first adhesive layer 310 or the second adhesive layer 315 may comprise, consist of, or consist essentially of an ultraviolet release tape. Alternatively, both of the first adhesive layer 310 and the second adhesive layer 315 may comprise, consist of, or consist essentially of a heat release tape. In this case, the first adhesive layer 310 may comprise, consist of, or consist essentially of a first heat release tape that is released upon application of heat at a first temperature (e.g., a lower temperature), and the second adhesive layer 315 may comprise, consist of, or consist essentially of a second heat release tape that is released upon application of heat at a second temperature (e.g., a higher temperature), that is higher than the first temperature, and that is not released upon application of heat at the first temperature.

In some implementations, the first adhesive layer 310 has a thickness in a range from approximately 5 microns to approximately 40 microns. This enables adherence of the first adhesive layer 310 to the inner support layer 305 while also enabling the first adhesive layer 310 to be released from the inner support layer 305 without adding significant manufacturing time (e.g., for dicing and/or release) and without releasing the second adhesive layer 315. In some implementations, the first adhesive layer 310 has a thickness a range from approximately 5 microns to approximately 30 microns. This narrower range of thicknesses for the first adhesive layer 310 may further decrease manufacturing time (e.g., a time required for dicing and/or release the first adhesive layer 310) and increase the likelihood that the second adhesive layer 315 is not released when the first adhesive layer 310 is released.

In some implementations, the second adhesive layer 315 has a thickness a range from approximately 5 microns to approximately 60 microns. This enables adherence of the second adhesive layer 315 to the inner support layer 305 and the semiconductor die while also enabling the first adhesive layer 310 to be released from the inner support layer 305 without releasing the second adhesive layer 315. In some implementations, the second adhesive layer 315 is thicker than the first adhesive layer 310 to increase the likelihood that the second adhesive layer 315 is not released when the first adhesive layer 310 is released. In some implementations, the second adhesive layer 315 has a thickness a range from approximately 5 microns to approximately 40 microns. In some implementations, the second adhesive layer 315 has a thickness a range from approximately 5 microns to approximately 30 microns. These narrower ranges of thicknesses for the second adhesive layer 315 may decrease manufacturing time (e.g., a time required for dicing and/or release of the second adhesive layer 315).

In some implementations, the mount tape 300 may be formed by adhering the first adhesive layer 310 to a first surface of the inner support layer 305 and adhering the second adhesive layer 315 to a second surface of the inner support layer 305 that is opposite the first surface. In some implementations, a manufacturing process for fabricating the mount tape 300 may include forming the first adhesive layer 310 using a die forming process, such as by melting a first material used to form the first adhesive layer 310 (e.g., a polymer), extruding the melted first material from an extruder into a die (e.g., a t-shaped die or a coat-hanger die) to form a shape of the first adhesive layer 310 (e.g., a sheet or strip for the mount tap 300), and cooling the first material to a solid form. The first adhesive layer 310 (e.g., solid material of the first adhesive layer 310) may then be laminated to the first surface of the inner support layer 305. The second adhesive layer 315 may also be formed using a die forming process, such as by melting a second material (which may be the same material as or a different material than the first material) used to form the second adhesive layer 315 (e.g., a polymer), extruding the melted second material from an extruder into a die (e.g., a t-shaped die or a coat-hanger die) to form a shape of the second adhesive layer 315 (e.g., a sheet or strip for the mount tap 300), and cooling the second material to a solid form. In some implementations, the second adhesive layer 315 may be formed, using the die forming process, on the second surface of the inner support layer 305. Additionally, or alternatively, the second adhesive layer 315 (e.g., solid material of the second adhesive layer 315) may be laminated to the second surface of the inner support layer 305. The combined first adhesive layer 310, inner support layer 305, and second adhesive layer 305 may be cut (e.g., using a pre-cut decal) to form the mount tape 300 and/or for easier mounting to a film frame or WS S.

The mount tape 300 described herein enables the first adhesive layer 310 to be released at a first stage of a semiconductor device manufacturing process without also releasing the second adhesive layer 315 at the first stage. After release, a semiconductor die, adhered to the inner support layer 305 via the second adhesive layer 315, may be picked (e.g., ejected) and placed on a target object. The inner support layer 305 may protect the semiconductor die from damage during the pick-and-place process. The second adhesive layer 315 may then be released at a second stage of the semiconductor device manufacturing process, and the inner support layer 305 may be removed (e.g., as part of the second stage or at a third stage of the semiconductor device manufacturing process). Additional details regarding the semiconductor device manufacturing process are described below in connection with FIGS. 4-13.

As indicated above, FIG. 3 is provided as an example. Other examples may differ from what is described with regard to FIG. 3.

FIGS. 4-12 are cross-sectional views at example process stages of an example semiconductor device manufacturing process for using the mount tape described herein to form an apparatus, such as the apparatus 100, the memory device 200, or another apparatus.

Figure 4:
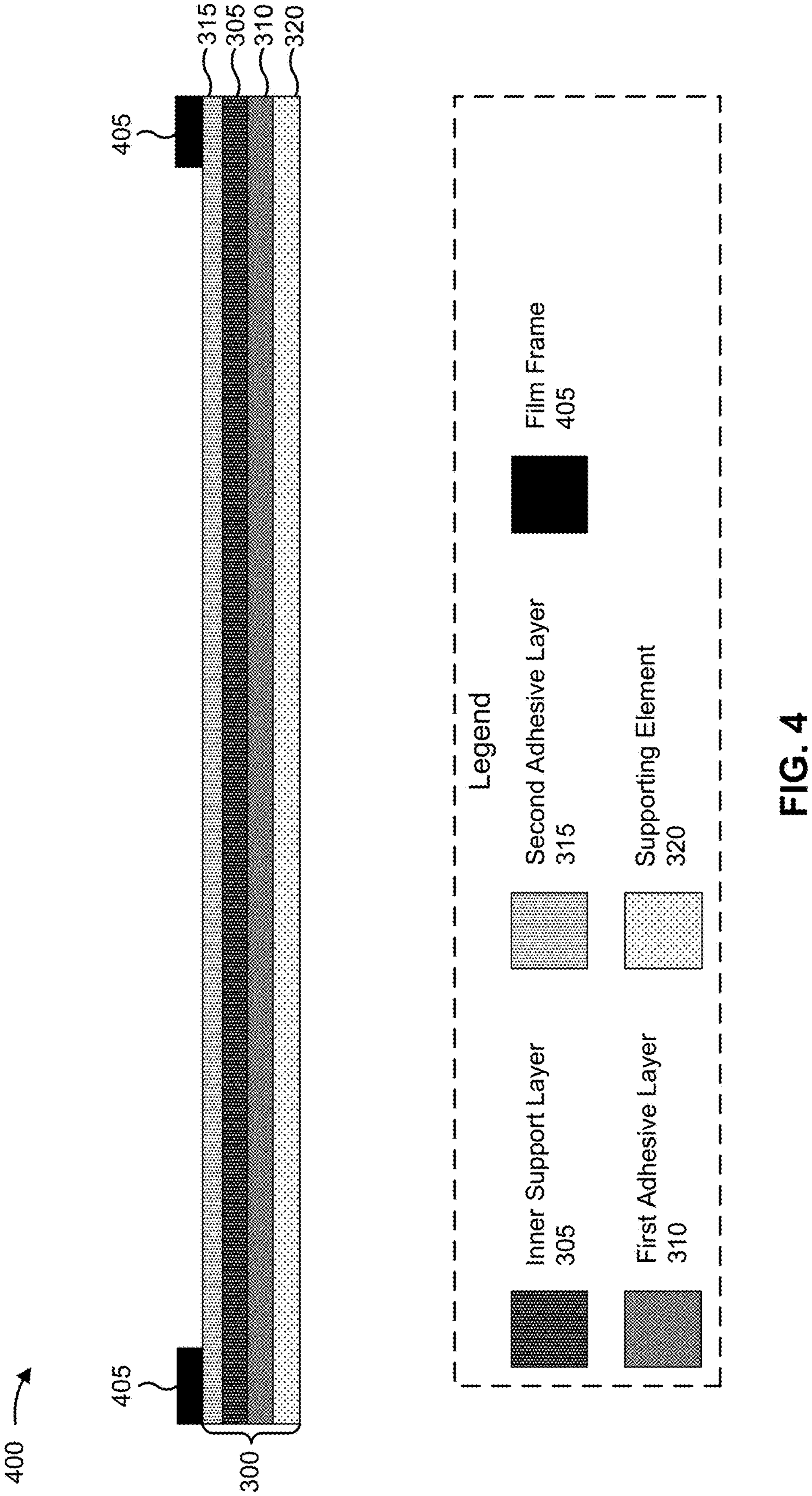
FIGS. 4-12 are cross-sectional views at example process stages of an example semiconductor device manufacturing process for using the mount tape described herein to form an apparatus.

FIG. 4 is a cross-sectional view, at an example process stage 400, of an example mount tape 300 adhered to a film frame 405 (e.g., a semiconductor film frame, such as a film frame ring). As shown, the mount tape 300 may include an inner support layer 305, a first adhesive layer 310, a second adhesive layer 315, and a supporting element 320, as described above in connection with FIG. 3.

As shown in FIG. 4, the process may include adhering the mount tape 300 to the film frame 405. For example, the second adhesive layer 315 may include a first surface adhered to the inner support layer 305 and a second surface, opposite the first surface, that adheres to the film frame 405. In FIG. 4, the entirety of the first surface of the second adhesive layer 315 is adhered to the inner support layer 305, while only a portion of the second surface of the second adhesive layer 315 is adhered to the film frame 405 (e.g., where the film frame 405 has a ring shape).

FIG. 4 shows the mount tape 300 adhered to a film frame 405 and also shows the mount tape 300 including the supporting element 320, such as a tape backing of the mount tape 300. However, in some implementations, a wafer support system may be used in the process instead of a film frame 405. In this case, the supporting element 320 may be the wafer support system (and thus may not be included in the mount tape 300), the film frame 405 may not be present, and the first adhesive layer 310 may include a first surface adhered to the inner support layer 305 and a second surface, opposite the first surface, that adheres to the wafer support system.

Figure 5:
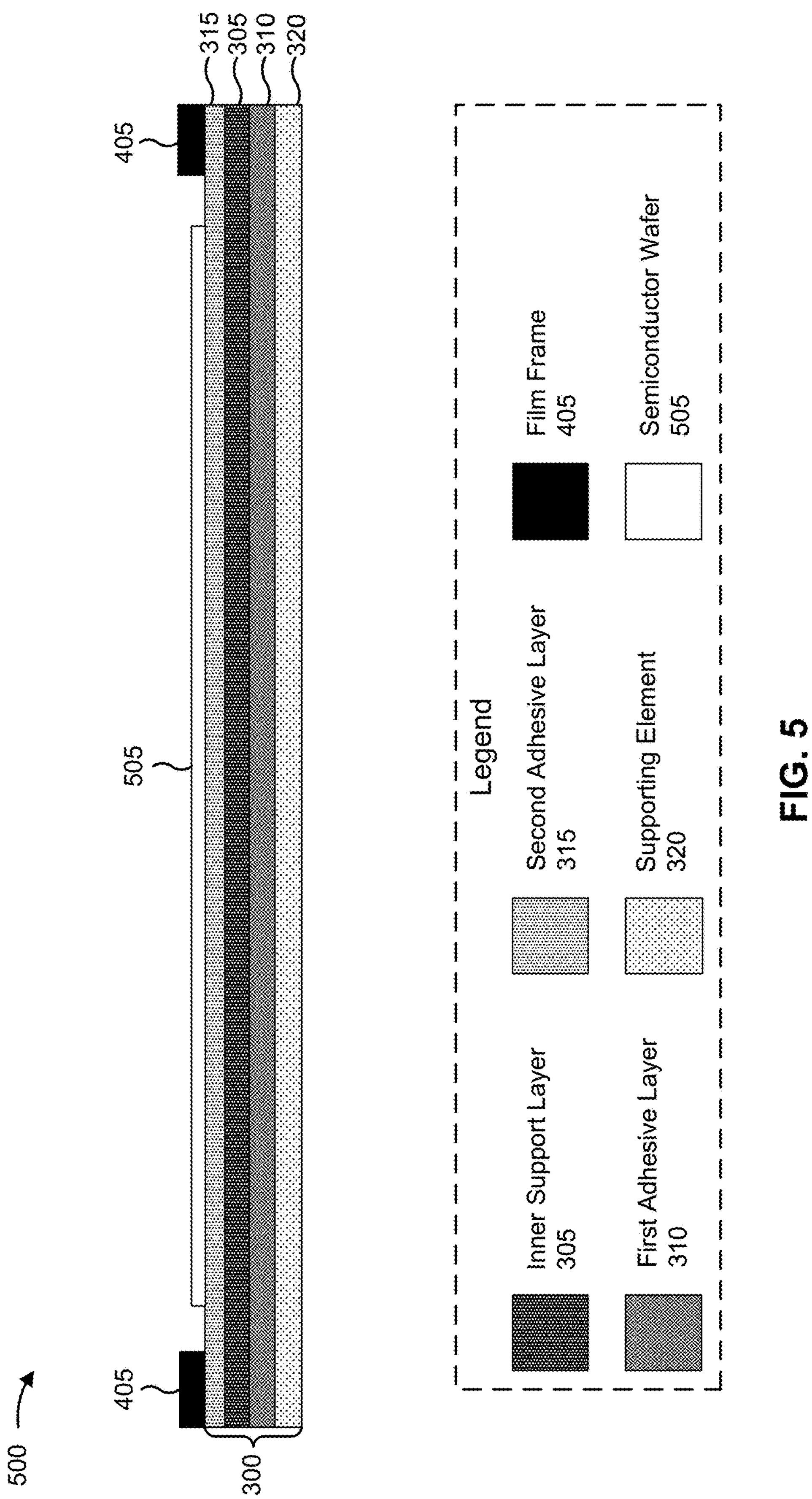

FIG. 5 is a cross-sectional view, at an example process stage 500 that is after the example process stage 400 of FIG. 4, of an example semiconductor wafer 505 mounted on the mount tape 300. In some implementations, the semiconductor wafer 505 (sometimes called a wafer) is a thin wafer having a thickness that is less than or equal to, for example, approximately 30 microns, approximately 20 microns, or thinner.

As shown in FIG. 5, the process may include mounting the semiconductor wafer 505 on the mount tape 300. As further shown, the semiconductor wafer 505 may be mounted on the second adhesive layer 315 opposite the inner support layer 305. For example, the second adhesive layer 315 may include a first surface adhered to the inner support layer 305 and a second surface, opposite the first surface, adhered to the semiconductor wafer 505.

Figure 6:
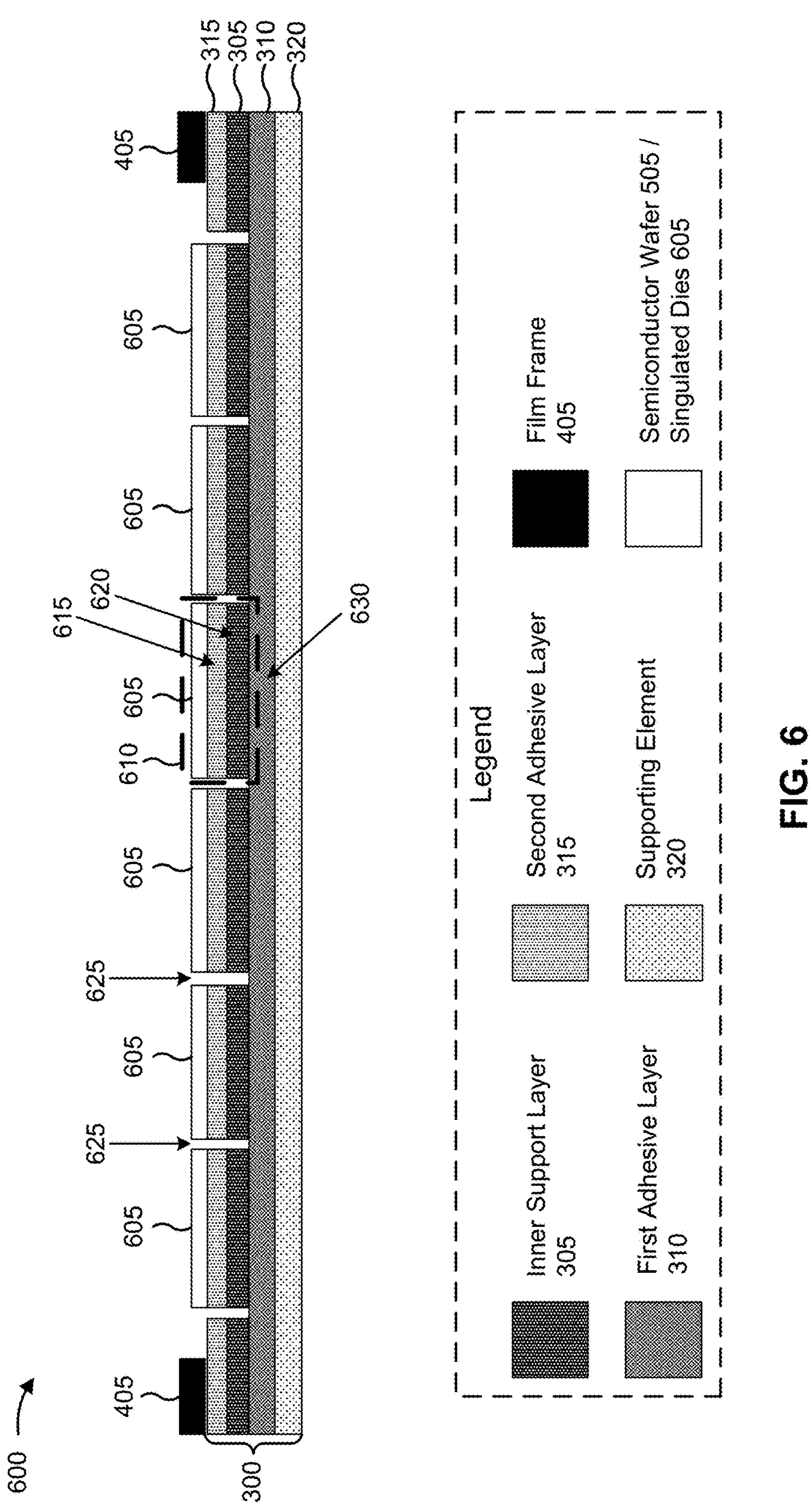

FIG. 6 is a cross-sectional view, at an example process stage 600 that is after the example process stage 500 of FIG. 5, of multiple (e.g., a plurality of) singulated semiconductor dies 605 formed from the semiconductor wafer 505.

As shown in FIG. 6, the process may include dicing the semiconductor wafer 505 to form a plurality of singulated semiconductor dies 605. In some implementations, the singulated semiconductor dies 605 are substantially identical to one another. A singulated semiconductor die 605 may be, for example, an integrated circuit 105 described above in connection with FIG. 1, a semiconductor die 115 described above in connection with FIG. 1, and/or a semiconductor die 225 described above in connection with FIG. 2.

As further shown in FIG. 6, dicing the semiconductor wafer 505 may include forming multiple (e.g., a plurality of) singulated structures 610 (with a single representative singulated structure 610 shown using a dashed line rectangle in FIG. 6). A singulated structure 610 may include a singulated semiconductor die 605, a corresponding portion 615 of the second adhesive layer 315 (e.g., a portion 615 that is directly beneath the singulated semiconductor die 605), and a corresponding portion 620 of the inner support layer 305 (e.g., a portion 620 that is directly beneath the portion 615 of the second adhesive layer 315 that is directly beneath the singulated semiconductor die 605). In other words, a singulated structure 610 may include a singulated semiconductor die 605, a portion 620 of the inner support layer 305 that is beneath the singulated semiconductor die (e.g., the portion 620 is beneath the singulated semiconductor die 605), and a portion 615 of the second adhesive layer 315 that adheres the portion 620 of the inner support layer 305 to the singulated semiconductor die 605.

As shown in FIG. 6, the process may include forming dicing lanes 625 to dice the semiconductor wafer 505 into the singulated semiconductor dies 605. The dicing lanes 625 may be formed by, for example, blade dicing (e.g., using a dicing blade), stealth dicing (e.g., using a laser), or plasma dicing (e.g., deep reactive-ion etching). In the example of FIG. 6, the dicing lanes 625 are formed through the semiconductor wafer 505, the second adhesive layer 315, and the inner support layer 305. In some implementations, the dicing lanes 625 need not extend through the first adhesive layer 310 because a portion 630 of the first adhesive layer 310 beneath the singulated structure 610 is released at a subsequent process stage (e.g., the portion 630 can be targeted for release), as described below in connection with FIG. 7. This may reduce an amount of time needed for dicing. Also, dicing through the first adhesive layer 310 may damage the supporting element 320.

However, in some implementations, the dicing lanes 625 may be formed in or through the first adhesive layer 310. For example, the dicing lanes 625 may extend vertically through all of the portion 630 of the first adhesive layer 310 that is directly beneath the portion 620 of the inner support layer 305, or may extend vertically through a portion of the portion 630 of the first adhesive layer 310. This may enable faster release of the portion 630 of the first adhesive layer when ejecting the singulated structure 610, as described below in connection with FIG. 7. In this case, a singulated structure 610 may include a singulated semiconductor die 605, a corresponding portion 615 of the second adhesive layer 315, and a corresponding portion 620 of the inner support layer 305, and a corresponding portion 630 of the first adhesive layer 310 (e.g., a portion 630 that is directly beneath the portion 620 of the inner support layer 305).

The inner support layer 305 may support the semiconductor wafer 505 during the dicing process, which may reduce stress and/or warpage of the resulting singulated semiconductor dies 605. Furthermore, the inner support layer 305 and/or the second adhesive layer 315 may protect the singulated semiconductor die from particle contamination by covering a portion of the semiconductor wafer 505 during the dicing process.

Figure 7:
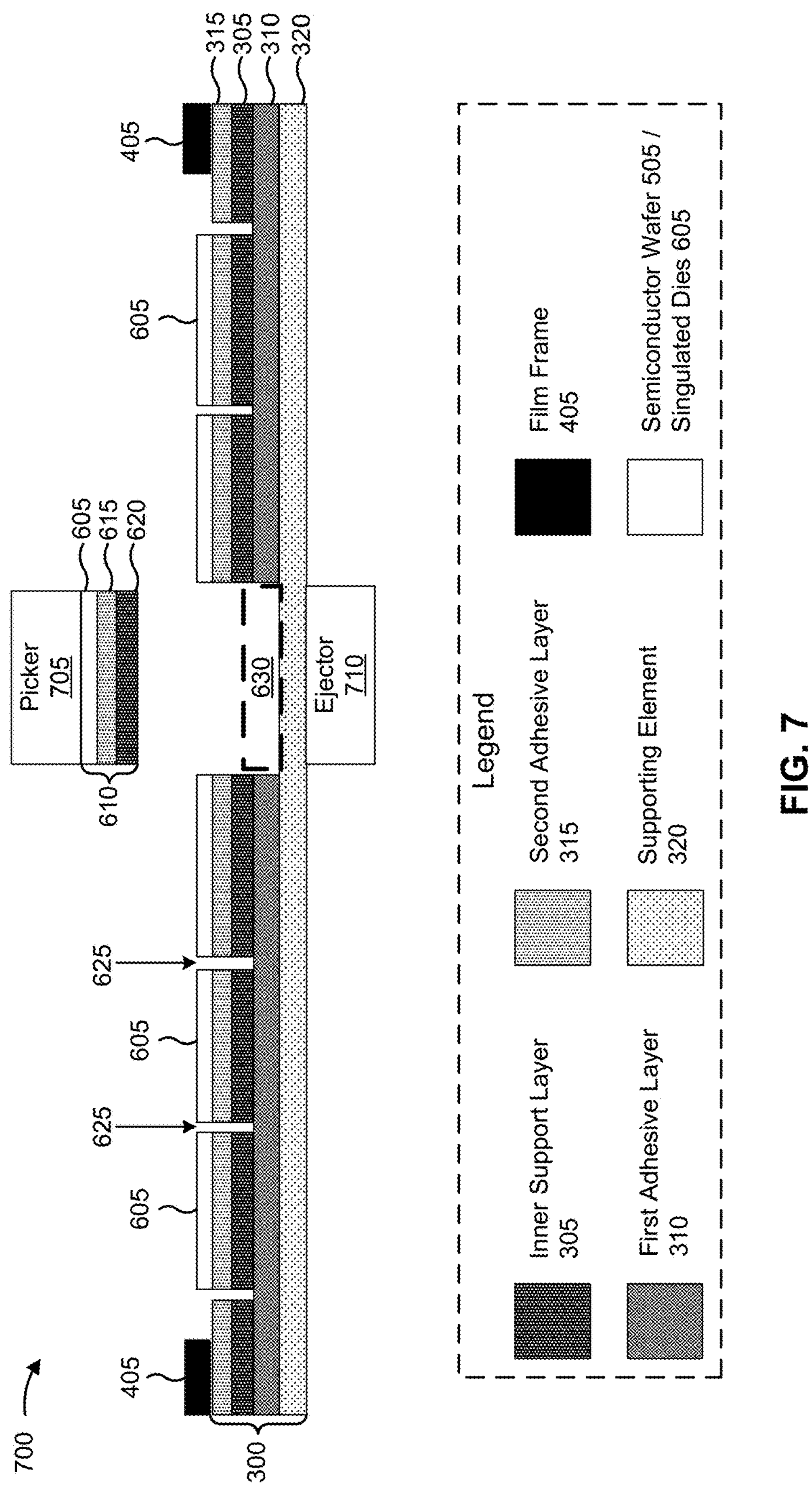

FIG. 7 is a cross-sectional view, at an example process stage 700 that is after the example process stage 600 of FIG. 6, of the portion 630 of the first adhesive layer 310 being released to enable the singulated structure 610 to be ejected and picked from the supporting element 320.

As shown in FIG. 7, the process may include releasing the first adhesive layer 310 (e.g., the portion 630 of the first adhesive layer 310) without releasing the second adhesive layer 315 (e.g., the portion 615 of the second adhesive layer 315). As shown, this enables a picker 705 (e.g., a pick-and-place machine, a bond head, a robotic arm, or the like) to pick the singulated structure 610 from the supporting element 320. As shown, the picked singulated structure 610 includes a singulated semiconductor die 605, a corresponding portion 615 of the second adhesive layer 315, and a corresponding portion 620 of the inner support layer 305. By picking both the singulated semiconductor die 605 and the portion 620 of the inner support layer 305, adhered to one another via the portion 615 of the second adhesive layer 315, damage to the singulated semiconductor die 605 may be prevented due to the strength and support provided by the portion 620 of the inner support layer 305. Furthermore, the inner support layer 305 and/or the second adhesive layer 315 may protect the singulated semiconductor die from particle contamination during transit by covering a portion of the semiconductor wafer 505 during the dicing process.

As further shown in FIG. 7, the portion 630 of the first adhesive layer 310 may be released using an ejector 710. The portion 630 is represented in FIG. 7 using a dashed line rectangle to indicate that the portion 630 has been released (e.g., by removing the portion 630 and/or breaking down adhesion between the portion 630 and the portion 620). In some implementations, the ejector 710 is an ultraviolet light ejector that releases the portion 630 by applying ultraviolet light (e.g., at a particular wavelength or in a particular range of wavelengths) to the portion 630 (e.g., through the supporting element 320, which may be transparent to the ultraviolet light, in a similar manner as described elsewhere herein). In some implementations, the first adhesive layer 310 may be configured to release a gas (e.g., nitrogen) upon exposure to ultraviolet light, which may assist in enabling the singulated structure 610 to be picked by the picker 705.

In the example process stage 700 of FIG. 7, the portion 630 of the first adhesive layer 310 is released using ultraviolet light. However, in some implementations, the portion 630 of the first adhesive layer 310 is released using heat (e.g., at a particular temperature or within a particular range of temperatures). In this case, the ejector 710 is a heat ejector configured to apply heat to the mount tape 300. In this case, the supporting element 320 need not be transparent (but can be). For example, the supporting element 320 may be opaque, translucent, or transparent.

Furthermore, in the example process stage 700 of FIG. 7, the portion 630 of the first adhesive layer 310 is released by applying ultraviolet light or heat from below the first adhesive layer 310 (e.g., the ejector 710 is shown below the mount tape 300). However, ultraviolet light or heat may be applied from a different direction (e.g., from above the first adhesive layer 310, the inner support layer 305, the second adhesive layer 315, and/or the mount tape 300). For example, the picker 705 may be configured with a light source (e.g., a light-emitting diode) to emit ultraviolet light toward the portion 630 of the first adhesive layer 310. In some implementations, the light source may be configured to maintain low temperatures while emitting ultraviolet light (e.g., via a light-emitting diode). Additionally, or alternatively, the picker 705 may be configured with a heat source (e.g., an infrared heat source, a laser, a conductive heat source, and/or a convection heat source) to emit heat toward the portion 630 of the first adhesive layer 310.

Furthermore, in the example process stage 700 of FIG. 7, the ejector 710 is shown as applying localized ultraviolet light (or heat, in some implementations) in a region bounded by the dicing lanes 625 that define the boundaries of the picked singulated structure 610. However, in some implementations, the ejector 710 may apply ultraviolet light or heat in a larger area, such as to a row of singulated structures 610, to a column of singulated structures 610, or to all of the singulated structures 610 (e.g., to all of the singulated semiconductor dies 605, mounted to the mount tape 300, and corresponding layers). For example, the ejector 710 may apply ultraviolet light to the entire semiconductor wafer 505 (e.g., all of the singulated semiconductor dies 605 formed from the semiconductor wafer 505) to expose the entire first adhesive layer 310 to the ultraviolet light. This may release and/or reduce the adhesion of the first adhesive layer 310. The picker 705 (e.g., a mechanical die ejector, such as a multistage mechanical die ejector, a slide ejector, a blade ejector, or a needle ejector) may then pick the singulated structure 610 easily because of the release and/or reduced adhesion of the first adhesive layer 310.

As another example, the adhesion of the first adhesive layer 310 may be released using a wafer level ultraviolet cure, such as by using an ultraviolet cure tool (not shown). The ultraviolet cure tool may apply ultraviolet light to the entire semiconductor wafer 505 to expose the entire first adhesive layer 310 to the ultraviolet light. The ejector 710 (e.g., in a pick and place tool separate from the ultraviolet cure tool) may then mechanically eject the singulated structure 610 to further release the singulated structure 610 from the supporting element 320 (e.g., a tape backing of the mount tape 300). For example, the ejector 710 may be a mechanical die ejector, such as a multistage ejector, a slider ejector, a blade ejector, or a needle ejector. The combination of wafer level ultraviolet cure and mechanical die ejection may enable the picker 705 to easily pick the singulated structure 610.

As described above in connection with FIG. 3, the inner support layer 305 (and the supporting element 320, in a similar manner as described in connection with the inner support layer 305) may be opaque or transparent depending on a direction from which ultraviolet light is applied and the environmental conditions used to release the first adhesive layer 310 and/or the second adhesive layer 315.

Because the first adhesive layer 310 is released in the process stage 700 without releasing the second adhesive layer 315, the process stage 700 may be considered the first stage, described above, during which the first adhesive layer 310 is released without releasing the second adhesive layer 315.

Figure 8:
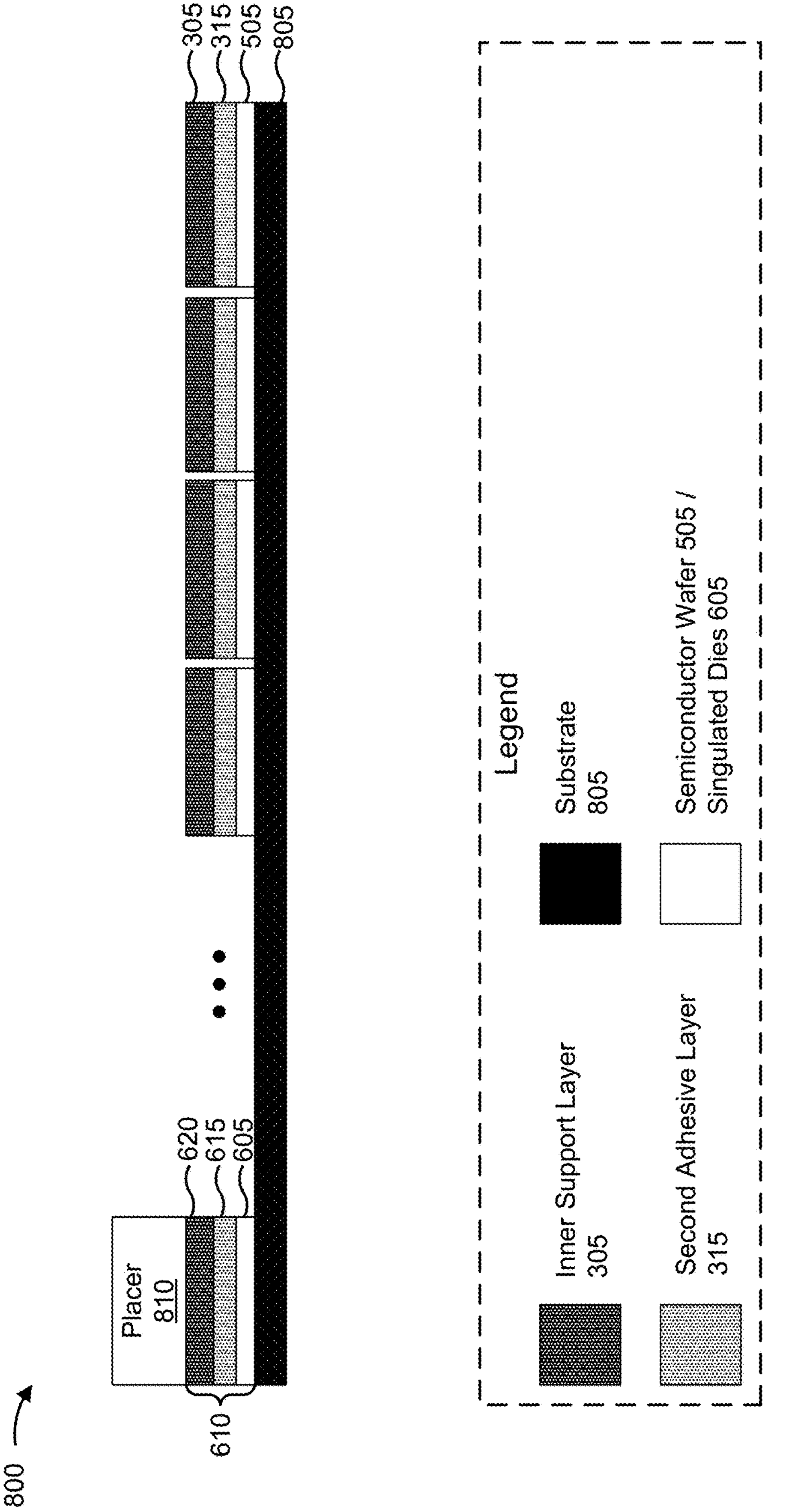

FIG. 8 is a cross-sectional view, at an example process stage 800 that is after the example process stage 700 of FIG. 7, of singulated structures 610 that have been placed on a substrate 805. Note that in FIG. 8 (as well as in FIGS. 9-12), the black color represents the substrate 805 rather than the film frame 405 depicted in FIGS. 4-7. As described above, a singulated structure 610 may include a singulated semiconductor die 605, a corresponding portion 615 of the second adhesive layer 315, and a corresponding portion 620 of the inner support layer 305.

As shown in FIG. 8, the process may include placing a picked singulated structure 610 on a target object. In some implementations, the target object is the substrate 805 (which may correspond to, for example, the substrate 110 described above in connection with FIG. 1 and/or the substrate 220 described above in connection with FIG. 2) or an interposer on the substrate 805. Alternatively, in the case of die stacking, the target object may be a singulated semiconductor die 605 (or an interposer on the singulated semiconductor die 605) that was previously picked and placed on the substrate 805 or on another singulated semiconductor die 605.

As shown in FIG. 8, the semiconductor die 605 of the singulated structure 610 may be placed on the target object (shown as the substrate 805 in FIG. 8). Thus, the singulated structure 610 may be flipped over after being picked and before being placed. As shown, a placer 810 (e.g., a pick-and-place machine, a bond head, a robotic arm, or the like) may place the singulated structure 610 on the target object. The placer 810 may be the same as the picker 705 of FIG. 7, in which case the picker 705/placer 810 may be configured to flip the singulated structure 610 after picking and prior to placing. Alternatively, the placer 810 may be different form the picker 705, in which case the placer 810 may be configured to grab the singulated structure 610 from the picker 705, such as by forming a vacuum seal between the placer 810 and the portion 620 of the inner support layer 305. The picker 705 may then release the singulated structure 610, such as by releasing a vacuum seal between the picker 705 and the singulated semiconductor die 605, after which the placer 810 may place the singulated structure 610 on the target object.

Figure 9:
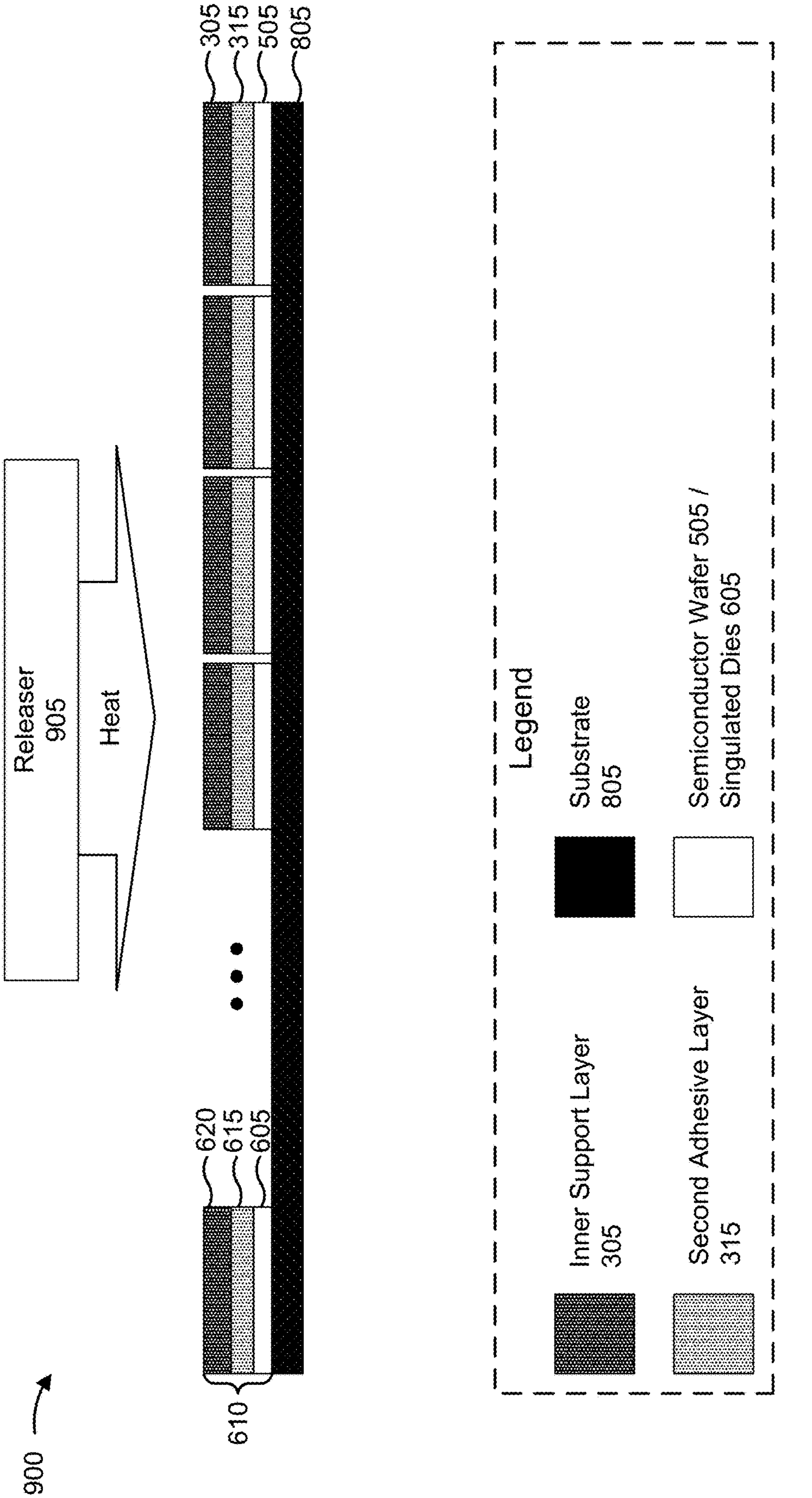

FIG. 9 is a cross-sectional view, at an example process stage 900 that is after the example process stage 800 of FIG. 8, of singulated structures 610 that have been placed on a substrate 805.

As shown in FIG. 9, the process may include releasing the second adhesive layer 315 to enable the inner support layer 305 to be separated from the singulated semiconductor dies 605. For example, the second adhesive layer 315 may be released using a releaser 905. In some implementations, the releaser 905 may apply heat to the second adhesive layer 315 (and the other layers shown in FIG. 9). As a result, the second adhesive layer 315 may be released by removing the second adhesive layer 315 (e.g., portions 615 of the second adhesive layer 315) and/or breaking down adhesion between the second adhesive layer 315 and the inner support layer 305 (e.g., between portions 615 and corresponding portions 620). In some implementations, the releaser 905 is a heat releaser that releases the second adhesive layer 315 by applying heat (e.g., at a particular temperature or in a particular range of temperatures) to the second adhesive layer 315. For example, the releaser 905 may be configured with a heat source, such as an infrared heat source, a laser (e.g., an infrared laser), a conductive heat source, a convection heat source, or the like.

In the example process stage 900 of FIG. 9, the second adhesive layer 315 is released using heat. However, in some implementations, the second adhesive layer 315 is released using ultraviolet light (e.g., at a particular wavelength or within a particular range of wavelengths). In this case, the releaser 905 is an ultraviolet releaser configured to apply ultraviolet light to the second adhesive layer 315. Furthermore, in the example process stage 900 of FIG. 9, the second adhesive layer 315 is released by applying ultraviolet light or heat from above the second adhesive layer 315 (e.g., the releaser 905 is shown above the inner support layer 305). However, ultraviolet light or heat may be applied from a different direction (e.g., from below the second adhesive layer 315, the singulated semiconductor dies 605, and/or the substrate 805). As described above in connection with FIG. 3, the inner support layer 305 may be opaque or transparent depending on a direction from which ultraviolet light is applied and the environmental conditions used to release the first adhesive layer 310 and/or the second adhesive layer 315.

In some implementations, the entire second adhesive layer 315 may be released at the same time, such as after placing a particular quantity of singulated structures 610 in a particular arrangement (e.g., depending on requirements of the resulting apparatus). In this case, the releaser 905 may apply ultraviolet light or heat in a generalized area rather than a localized area. For example, the releaser 905 may apply ultraviolet light or heat to all singulated structures 610 that have been placed, rather than to a single singulated structure 610.

Because the second adhesive layer 315 is released in the process stage 900, the process stage 900 may be considered the second stage, described above, during which the second adhesive layer 315 is released.

Figure 10:
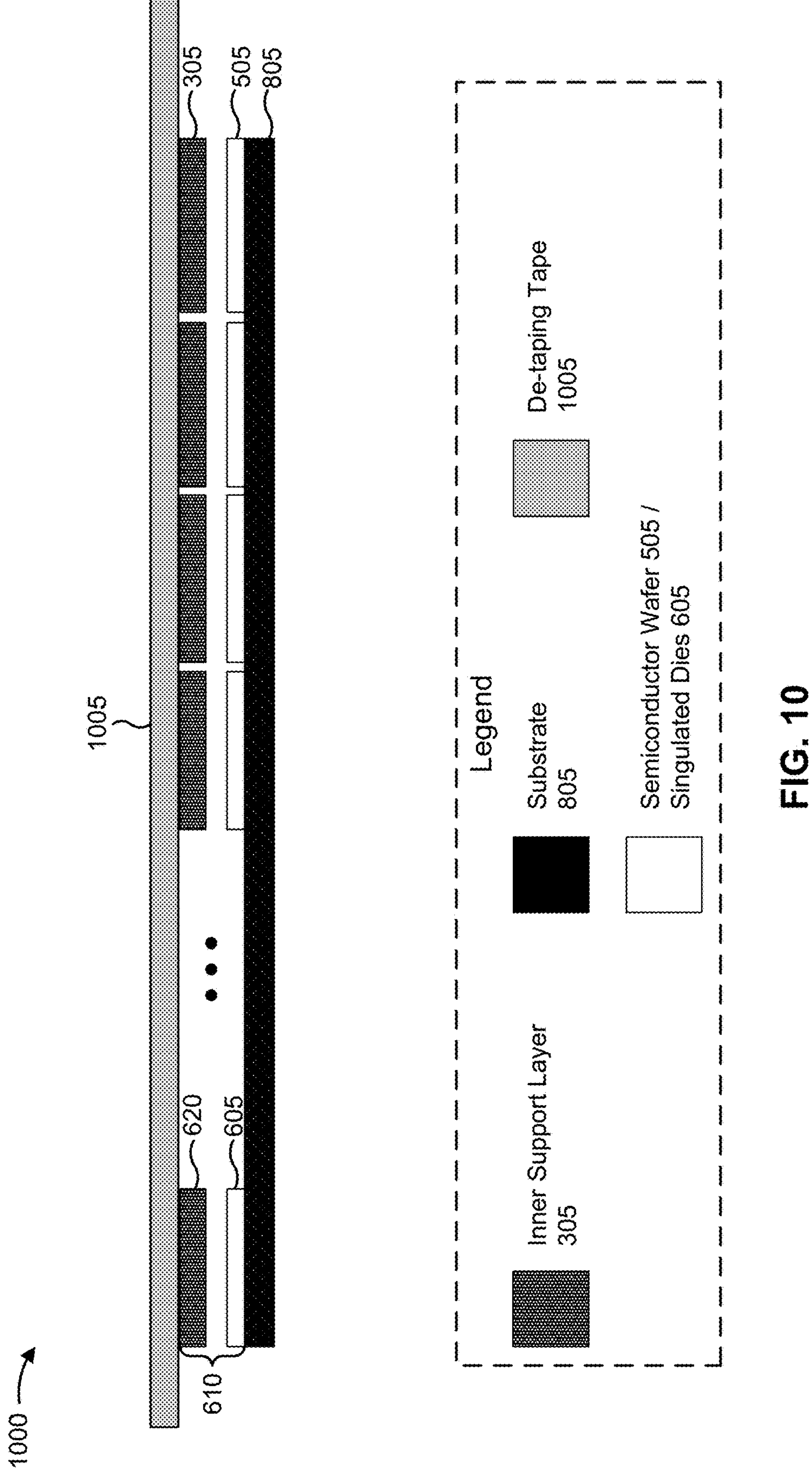

FIG. 10 is a cross-sectional view, at an example process stage 1000 that is after the example process stage 900 of FIG. 9, of singulated structures 610 that have been placed on a substrate 805. In FIG. 10, the second adhesive layer 315 has been released, as shown by a gap between the singulated semiconductor dies 605 and corresponding portions 620 of the inner support layer 305.

As shown in FIG. 10, the process may include separating portions 620 of the inner support layer 305 from the singulated semiconductor dies 605. For example, this separation may be achieved by a de-taping process. For example, the process may include applying (e.g., adhering) de-taping tape 1005 to the portions 620 of the inner support layer 305 and separating the portions 620 from the singulated semiconductor dies 605 by a mechanical process that pulls or peels the de-taping tape with the portions 620 adhered thereto.

Because the inner support layer 305 is removed in the process stage 1000, the process stage 1000 may be considered the third stage, described above, during which the inner support layer 305 is removed.

Figure 11:
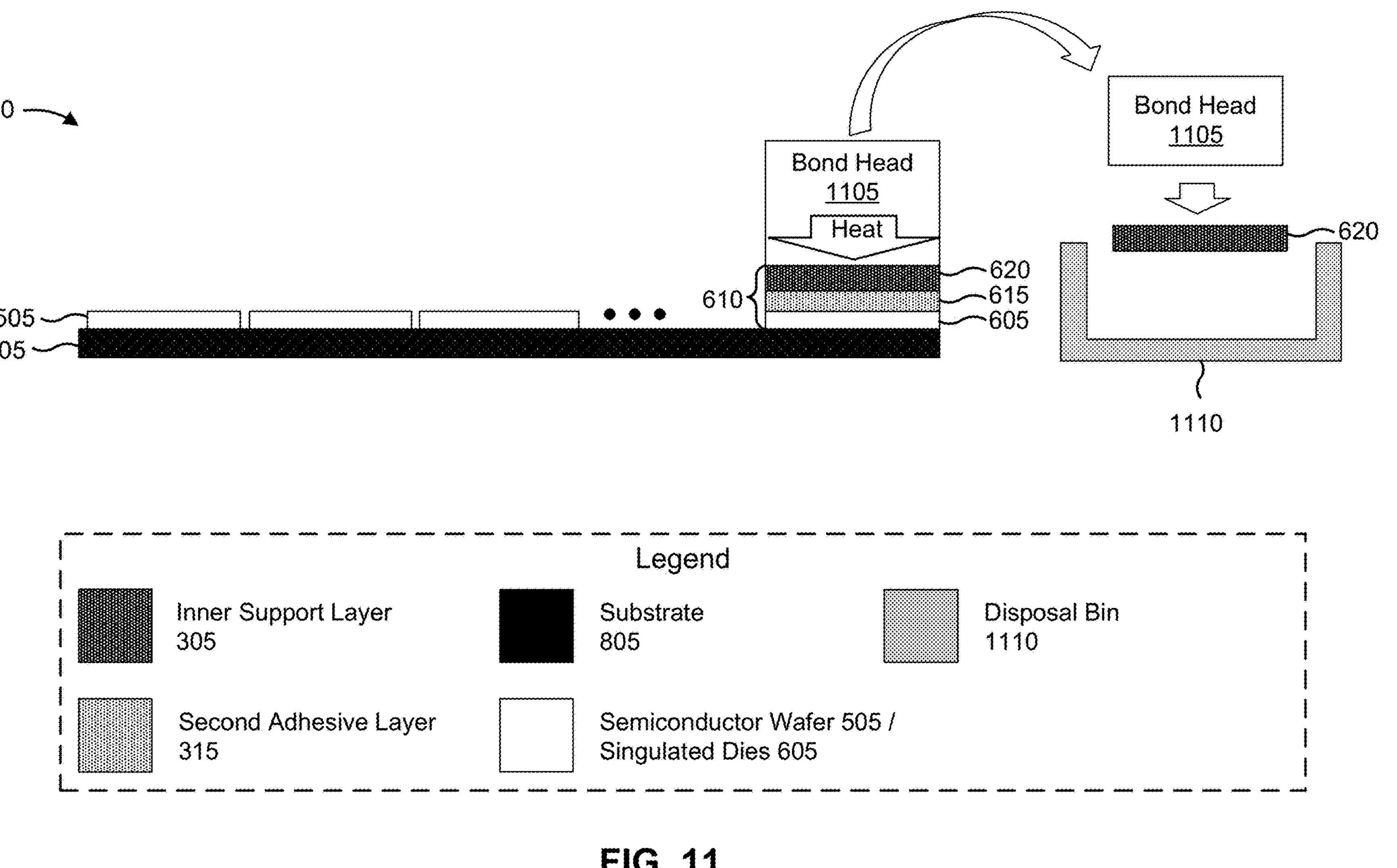

FIG. 11 is a cross-sectional view, at an example process stage 1100 that is after the example process stage 700 of FIG. 7, of placement of a singulated structure 610 on a substrate 805. In some implementations, the example process stage 1100 of FIG. 11 may be performed instead of the example process stages 800 through 1000 of FIGS. 8 through 10. As described above, a singulated structure 610 may include a singulated semiconductor die 605, a corresponding portion 615 of the second adhesive layer 315, and a corresponding portion 620 of the inner support layer 305.

As shown in FIG. 11, the process may include placing a picked singulated structure 610 on a target object, as described above in connection with FIG. 8. In FIG. 11, a bond head 1105 is shown as placing the picked singulated structure 610 on the substrate 805. The bond head 1105 may operate as described above in connection with the picker 705 and/or the placer 810. However, the bond head 1105 may be configured to release the second adhesive layer 315, such as the portion 615 of the second adhesive layer 315 included in the placed singulated structure 610.

For example, after placing the singulated structure 610 on the target object, the bond head 1105 may release the portion 615 of the second adhesive layer 315 by applying ultraviolet light and/or heat to the second adhesive layer 315. For example, the bond head 1105 may be configured with a heat source to emit heat toward the portion 615 of the second adhesive layer 315, as shown in FIG. 11. In some cases, heat applied by the bond head 1105 may also assist with forming interconnects and/or bonds between the singulated semiconductor die 605 and the substrate 805, such as by melting solder balls.

Additionally, or alternatively, the bond head 1105 may be configured with a light source to emit ultraviolet light toward the portion 615 of the second adhesive layer 315. If the bond head 1105 is configured to emit ultraviolet light toward the portion 615 of the second adhesive layer 315, then the inner support layer 305 may be transparent to enable that ultraviolet light to be applied to the portion 615 of the second adhesive layer 315, as described elsewhere herein.

After releasing the portion 615 of the second adhesive layer 315, the bond head 1105 may be configured to separate the portion 620 of the inner support layer 305 from the singulated semiconductor die 605. For example, the bond head 1105 may hold the singulated structure 610 by forming a vacuum seal between the bond head 1105 and the portion 620 of the inner support layer 305. After releasing the portion 615 of the second adhesive layer 315, the bond head 1105 may move away from the singulated semiconductor die 605 while the portion 620 of the inner support layer 305 is still held by the bond head 1105. As shown, the bond head 1105 may move to an area above a disposal bin 1110, and may dispose of the portion 620 of the inner support layer 305 by dropping the portion 620 in the disposal bin 1110. For example, the bond head 1105 may release a vacuum seal between the bond head 1105 and the portion 620 and/or may eject the portion 620 using a gas (e.g., air or nitrogen) after moving to the area above the disposal bin 1110.

Because the second adhesive layer 315 is released in the process stage 1100, the process stage 1100 may be considered the second stage, described above, during which the second adhesive layer 315 is released. In some implementations, the inner support layer 305 is also removed at the second stage, such as the process stage 1100. Alternatively, a first part of the process stage 1100 (e.g., releasing of the second adhesive layer 315 by application of heat or ultraviolet light by the bond head 1105) may be considered the second stage, described above, during which the second adhesive layer 315 is released, and a second part of the process stage 1100 (e.g., moving the inner support layer 305 to the disposal in 1110) may be considered the third stage, described above, during which the inner support layer 305 is removed.

Figure 12:
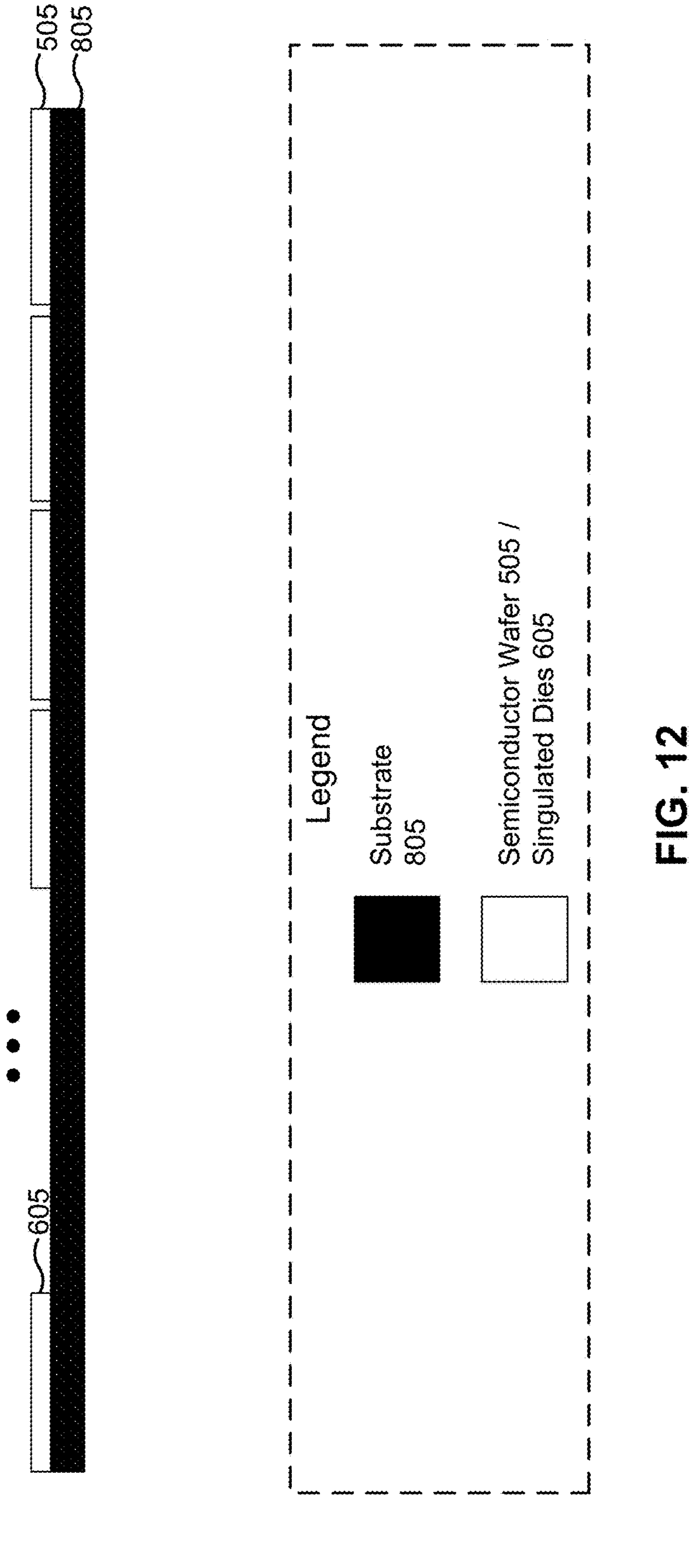

FIG. 12 is a cross-sectional view, at an example process stage 1200 that is after either the example process stage 1000 of FIG. 10 (if process stages 800 through 1000 of FIGS. 8 through 10 are performed) or the example process stage 1100 of FIG. 11 (if process stage 1100 FIG. 11 is performed), of singulated semiconductor dies 605 that remain on a substrate 805 after separation of the inner support layer 305 from the singulated semiconductor dies 605. After the inner support layer 305 has been separated from the singulated semiconductor dies 605, the process described herein may be repeated (e.g., after cleaning), such as to stack semiconductor dies 605 on top of one another. As a result, a stacked die structure may be formed on the substrate 805, as described above in connection with the apparatus 100 of FIG. 1 and the memory device 200 of FIG. 2.

As indicated above, the process stages described in connection with FIGS. 4-12 are provided as examples. Other examples may differ from what is described with respect to FIGS. 4-12.

Figure 13:
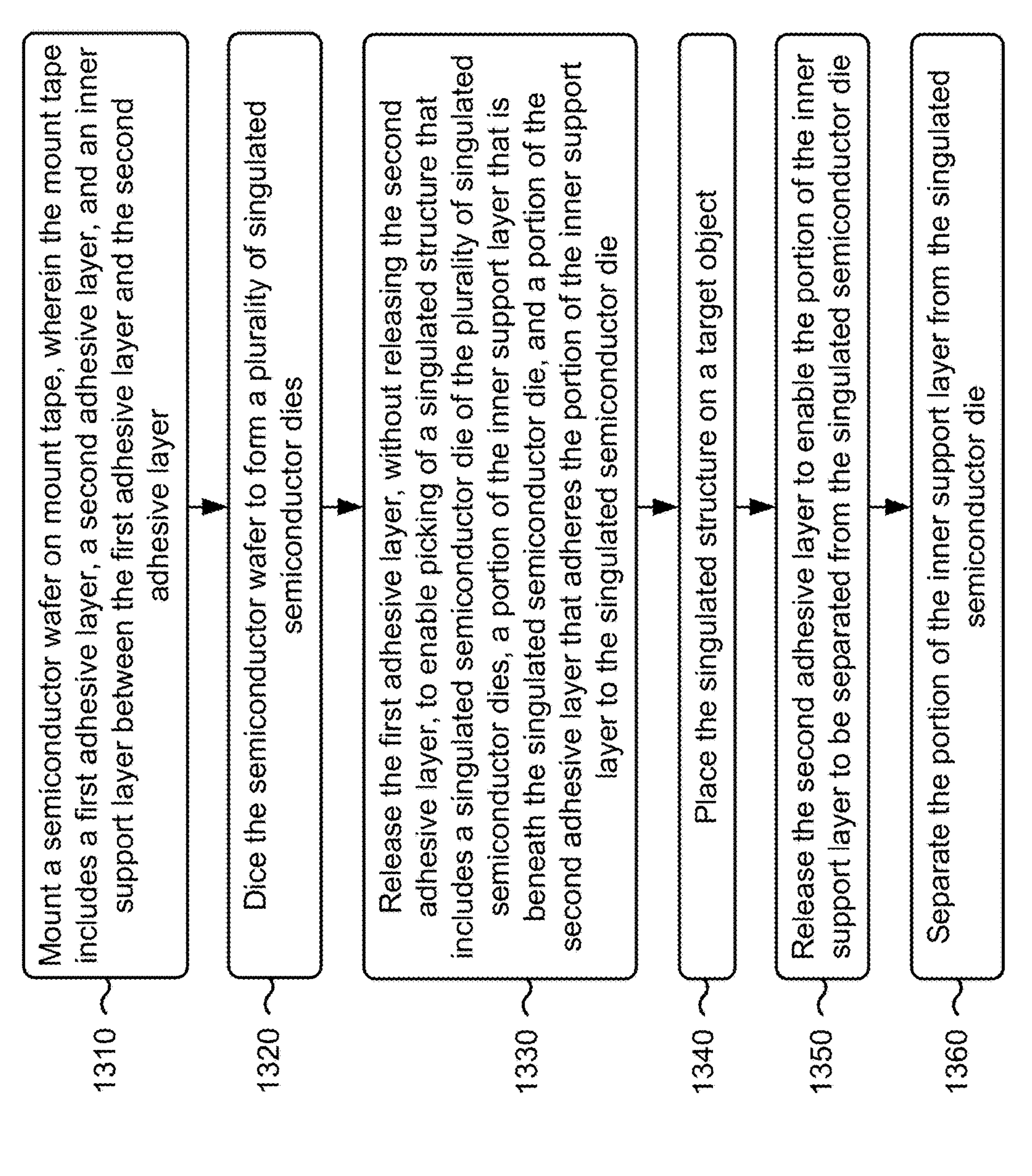
FIG. 13 is a flowchart of an example method of forming an apparatus using mount tape having an inner support layer between adhesive layers.

FIG. 13 is a flowchart of an example method 1300 of forming an apparatus (e.g., the apparatus 100 and/or the memory device 200) using mount tape having an inner support layer between adhesive layers. In some implementations, one or more process blocks of FIG. 13 may be performed by various semiconductor manufacturing equipment.

As shown in FIG. 13, the method 1300 may include mounting a semiconductor wafer on mount tape, wherein the mount tape includes a first adhesive layer, a second adhesive layer, and an inner support layer between the first adhesive layer and the second adhesive layer (block 1310). As further shown in FIG. 13, the method 1300 may include dicing the semiconductor wafer to form a plurality of singulated semiconductor dies (block 1320). As further shown in FIG. 13, the method 1300 may include releasing the first adhesive layer, without releasing the second adhesive layer, to enable picking of a singulated structure that includes: a singulated semiconductor die of the plurality of singulated semiconductor dies, a portion of the inner support layer that is beneath the singulated semiconductor die, and a portion of the second adhesive layer that adheres the portion of the inner support layer to the singulated semiconductor die (block 1330). As further shown in FIG. 13, the method 1300 may include placing the singulated structure on a target object (block 1340). As further shown in FIG. 13, the method 1300 may include releasing the second adhesive layer to enable the portion of the inner support layer to be separated from the singulated semiconductor die (block 1350). As further shown in FIG. 13, the method 1300 may include separating the portion of the inner support layer from the singulated semiconductor die (block 1360).

The method 1300 may include additional implementations, such as any single implementation or any combination of implementations described below and/or in connection with one or more other methods described elsewhere herein.

In some implementations, releasing the first adhesive layer comprises applying ultraviolet light to the first adhesive layer, and releasing the second adhesive layer comprises applying heat to the second adhesive layer. In some implementations, releasing the first adhesive layer comprises applying heat to the first adhesive layer, and releasing the second adhesive layer comprises applying ultraviolet light to the second adhesive layer.

In some implementations, releasing the first adhesive layer comprises applying ultraviolet light of a first wavelength to the first adhesive layer, and releasing the second adhesive layer comprises applying ultraviolet light of a second wavelength to the second adhesive layer. In some implementations, releasing the first adhesive layer comprises applying a heat at a first temperature to the first adhesive layer, and releasing the second adhesive layer comprises applying heat at a second temperature to the second adhesive layer. In some implementations, the second temperature is higher than the first temperature.

In some implementations, releasing the first adhesive layer comprises applying ultraviolet light or heat to the first adhesive layer, and releasing the second adhesive layer comprises de-taping the second adhesive layer. In some implementations, releasing the second adhesive layer comprises applying heat to the second adhesive layer via a bond head that places the singulated structure on the target object.

In some implementations, dicing the semiconductor wafer comprises forming a plurality of singulated structures, including the singulated structure, that each include a corresponding singulated semiconductor die, a corresponding portion of the inner support layer, and a corresponding portion of the second adhesive layer. In some implementations, the semiconductor wafer has a thickness that is less than or equal to approximately 30 microns.

Although FIG. 13 shows example blocks of the method 1300, in some implementations, the method 1300 may include additional blocks, fewer blocks, different blocks, or differently arranged blocks than those depicted in FIG. 13. In some implementations, the method 1300 may include forming the apparatus 100 and/or the memory device 200, a system that includes the apparatus 100 and/or the memory device 200, and/or any part described herein of the apparatus 100 and/or the memory device 200. For example, the method 1300 may include forming one or more of the parts 105-140 and/or 205-225. In some implementations, the example process described above in connection with FIGS. 4-12 may correspond to the method 1300 and/or one or more blocks of the method 1300. However, the process described above in connection with FIGS. 4-12 is an example, and other example processes may be used when performing the method 1300.

Figure 14:
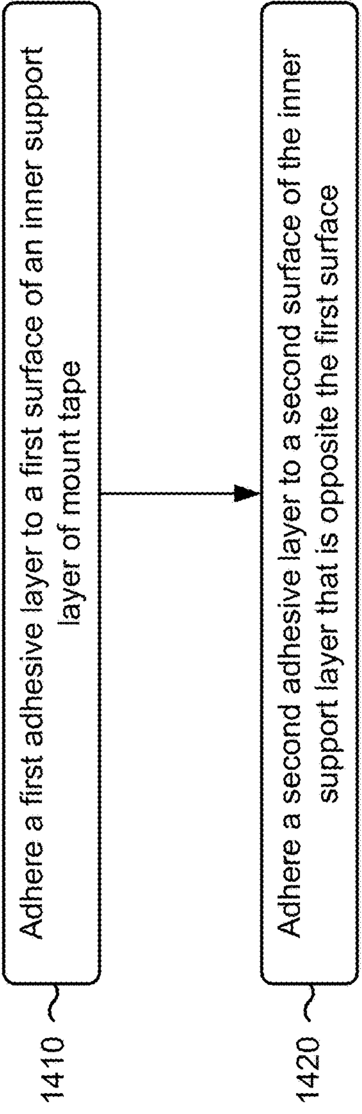
FIG. 14 is a flowchart of an example method of forming mount tape having an inner support layer between adhesive layers.

FIG. 14 is a flowchart of an example method 1400 of forming mount tape (e.g., mount tape 300) having an inner support layer between adhesive layers. In some implementations, one or more process blocks of FIG. 14 may be performed by various manufacturing equipment.

As shown in FIG. 14, the method 1400 may include adhering a first adhesive layer to a first surface of an inner support layer of mount tape (block 1410). As further shown in FIG. 14, the method 1400 may include adhering a second adhesive layer to a second surface of the inner support layer that is opposite the first surface (block 1420). In some implementations, the method 1400 may include adhering a tape backing (e.g., a first tape backing) to the second adhesive layer. For example, the second adhesive layer may have a first surface adhered to the inner support layer and a second surface adhered to the tape backing. Additionally, or alternatively, the method 1400 may include adhering a tape backing (e.g., a second tape backing) to the first adhesive layer. For example, the first adhesive layer may have a first surface adhered to the inner support layer and a second surface adhered to the tape backing.

The inner support layer may have the characteristics of the inner support layer 305 described herein. The first adhesive layer may have the characteristics of the first adhesive layer 310 described herein. The second adhesive layer may have the characteristics of the second adhesive layer 315 described herein.

In some implementations, the method 1400 may include forming the first adhesive layer 310 using a die forming process. For example, the method 1400 may include melting a first material used to form the first adhesive layer 310 (e.g., a polymer), extruding the melted first material from an extruder into a die (e.g., a t-shaped die or a coat-hanger die) to form a shape of the first adhesive layer 310 (e.g., a sheet or strip for the mount tap 300), and cooling the first material to a solid form. In some implementations, the method 1400 may include laminating the first adhesive layer 310 (e.g., solid material of the first adhesive layer 310) to the first surface of the inner support layer 305.

In some implementations, the method 1400 may include forming the second adhesive layer 315 using a die forming process. For example, the method 1400 may include melting a second material used to form the second adhesive layer 315 (e.g., a polymer), extruding the melted second material from an extruder into a die (e.g., a t-shaped die or a coat-hanger die) to form a shape of the second adhesive layer 315 (e.g., a sheet or strip for the mount tap 300), and cooling the second material to a solid form. In some implementations, the second material of the second adhesive layer 315 is the same as the first material of the first adhesive layer 310. Alternatively, the second material of the second adhesive layer 315 may be a different material than the first material of the first adhesive layer 310.

In some implementations, the method 1400 may include forming the second adhesive layer 315 on the second surface of the inner support layer 305 using the die forming process. Additionally, or alternatively, the method 1400 may include laminating the second adhesive layer 315 (e.g., solid material of the second adhesive layer 315) to the second surface of the inner support layer 305. In some implementations, the method 1400 may include cutting the combined first adhesive layer 310, inner support layer 305, and second adhesive layer 305 to form the mount tape 300.

Although FIG. 14 shows example blocks of the method 1400, in some implementations, the method 1400 may include additional blocks, fewer blocks, different blocks, or differently arranged blocks than those depicted in FIG. 14.

In some implementations, a method includes mounting a semiconductor wafer on mount tape, wherein the mount tape includes a first adhesive layer, a second adhesive layer, and an inner support layer between the first adhesive layer and the second adhesive layer; dicing the semiconductor wafer to form a plurality of singulated semiconductor dies; releasing the first adhesive layer, without releasing the second adhesive layer, to enable picking of a singulated structure that includes: a singulated semiconductor die of the plurality of singulated semiconductor dies, a portion of the inner support layer that is beneath the singulated semiconductor die, and a portion of the second adhesive layer that adheres the portion of the inner support layer to the singulated semiconductor die; placing the singulated structure on a target object; and releasing the second adhesive layer to enable the portion of the inner support layer to be separated from the singulated semiconductor die; and separating the portion of the inner support layer from the singulated semiconductor die.

In some implementations, a mount tape assembly includes a first adhesive layer configured for release at a first stage of a semiconductor device manufacturing process; a second adhesive layer configured for release at a second stage of the semiconductor device manufacturing process; and an inner support layer positioned between the first adhesive layer and the second adhesive layer and configured for removal during the semiconductor device manufacturing process.

In some implementations, a mount tape configured for use in a semiconductor device manufacturing process includes a first adhesive layer in contact with a first surface of an inner support layer of the mount tape, wherein the first adhesive layer is configured to be released from the first surface of the inner support layer upon exposure to a first environmental condition; a second adhesive layer in contact with a second surface of the inner support layer of the mount tape, wherein the second surface is opposite the first surface, wherein the second adhesive layer is configured to adhere the second surface of the inner support layer to a semiconductor substrate, and wherein the second adhesive layer is configured to be released from the second surface of the inner support layer upon exposure to a second environmental condition that is different from the first environmental condition; and the inner support layer, wherein the inner support layer is between the first adhesive layer and the second adhesive layer.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A mount tape assembly, comprising:

an inner support layer between a first adhesive layer and a second adhesive layer;

the first adhesive layer between the inner support layer and a support element; and the second adhesive layer between the inner support layer and a semiconductor wafer, wherein the mount tape assembly and the semiconductor wafer are configured to be diced simultaneously in a semiconductor device manufacturing process to form a singulated structure;

wherein the singulated structure comprises a singulated semiconductor die, a singulated portion of the second adhesive layer, and a singulated portion of the inner support layer;

wherein the first adhesive layer is configured for release at a first stage of the semiconductor device manufacturing process;

wherein the first stage comprises a separation of the singulated structure from the support element based on the release of the first adhesive layer;

wherein the singulated structure is configured for placement of the singulated semiconductor die on a semiconductor substrate;

wherein the singulated portion of the second adhesive layer is configured for release at a second stage of the semiconductor device manufacturing process; and wherein the second stage comprises a separation of the singulated portion of the inner support layer from the singulated semiconductor die based on the release of the singulated portion of the second adhesive layer and after the placement of the singulated semiconductor die.

2. The mount tape assembly of claim 1, wherein the first adhesive layer comprises, consists of, or consists essentially of a first material, and the second adhesive layer comprises, consists of, or consists essentially of a second material that is different from the first material.

3. The mount tape assembly of claim 1, wherein the inner support layer comprises, consists of, or consists essentially of glass, silicon, sapphire, metal, or polyimide.

4. The mount tape assembly of claim 1, wherein the inner support layer has a thickness in a range from approximately 10 microns to approximately 100 microns.

5. The mount tape assembly of claim 1, wherein the inner support layer has a thickness in a range from approximately 30 microns to approximately 50 microns.

6. The mount tape assembly of claim 1, wherein the inner support layer is opaque.

7. The mount tape assembly of claim 1, wherein the inner support layer is transparent.

8. The mount tape assembly of claim 1, wherein at least one of the first adhesive layer or the second adhesive layer comprises, consists of, or consists essentially of an ultraviolet release tape.

9. The mount tape assembly of claim 1, wherein at least one of the first adhesive layer or the second adhesive layer comprises, consists of, or consists essentially of a heat release tape.

10. The mount tape assembly of claim 1, wherein the first adhesive layer comprises, consists of, or consists essentially of an ultraviolet release tape, and wherein the second adhesive layer comprises, consists of, or consists essentially of a heat release tape.

11. The mount tape assembly of claim 1, wherein at least one of the first adhesive layer or the second adhesive layer has a thickness in a range from approximately 5 microns to approximately 40 microns.

12. A mount tape configured for use in a semiconductor device manufacturing process, comprising:

a first adhesive layer in contact with a first surface of a singulated portion of an inner support layer of the mount tape, wherein the first adhesive layer is configured to be released from the first surface of the singulated portion of the inner support layer upon exposure to a first environmental condition, and wherein the first adhesive layer is configured to separate a singulated semiconductor die from a support element based on release from the first surface of the singulated portion of the inner support layer;

a singulated portion of a second adhesive layer in contact with a second surface of the singulated portion of the inner support layer of the mount tape, wherein the mount tape and a semiconductor wafer are configured to be diced simultaneously in the semiconductor device manufacturing process to form a singulated structure, wherein the singulated structure comprises the singulated semiconductor die, the singulated portion of the second adhesive layer, and the singulated portion of the inner support layer, wherein the second surface is opposite the first surface, wherein the singulated portion of the second adhesive layer is configured to adhere the second surface of the inner support layer to the singulated semiconductor die, wherein the singulated semiconductor die is configured for placement on a semiconductor substrate, and wherein the singulated portion of the second adhesive layer is configured to be released from the singulated semiconductor die upon exposure to a second environmental condition that is different from the first environmental condition; and the singulated portion of the inner support layer, wherein the singulated portion of the inner support layer is between the first adhesive layer and the second adhesive layer, and wherein the singulated portion of the inner support layer is configured to be removed from the singulated semiconductor die based on release of the singulated portion of the second adhesive layer from the singulated semiconductor die.

13. The mount tape of claim 12, wherein one of the first adhesive layer or the second adhesive layer comprises, consists of, or consists essentially of a heat release tape, and wherein the other of the first adhesive layer or the second adhesive layer comprises, consists of, or consists essentially of an ultraviolet release tape.

14. The mount tape of claim 12, wherein the second adhesive layer has a thickness in a range from approximately 5 microns to approximately 60 microns.

15. The mount tape of claim 12, wherein the inner support layer comprises, consists of, or consists essentially of glass, silicon, sapphire, metal, or polyimide and has a thickness in a range from approximately 10 microns to approximately 100 microns.

16. The mount tape of claim 12, wherein the inner support layer has a thickness in a range from approximately 30 microns to approximately 50 microns.

* * * * *